(12) United States Patent
Lou et al.

(10) Patent No.: US 12,211,436 B2
(45) Date of Patent: Jan. 28, 2025

(54) DISPLAY PANEL AND DISPLAY APPARATUS

(71) Applicant: KunShan Go-Visionox Opto-Electronics Co., Ltd, Jiangsu (CN)

(72) Inventors: Junhui Lou, Jiangsu (CN); Lin Ge, Jiangsu (CN); Yong Wu, Jiangsu (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 0 days.

(21) Appl. No.: 18/460,051

(22) Filed: Sep. 1, 2023

(65) Prior Publication Data

US 2023/0410736 A1 Dec. 21, 2023

Related U.S. Application Data

(63) Continuation of application No. PCT/CN2022/108236, filed on Jul. 27, 2022.

(30) Foreign Application Priority Data

Dec. 15, 2021 (CN) .......................... 202123155370.7

(51) Int. Cl.
*G09G 3/3225* (2016.01)

(52) U.S. Cl.
CPC ... *G09G 3/3225* (2013.01); *G09G 2300/0443* (2013.01); *G09G 2300/0465* (2013.01);
(Continued)

(58) Field of Classification Search
CPC ......... G09G 3/3225; G09G 2300/0443; G09G 2300/0465; G09G 2300/0842; G09G 2320/0233
(Continued)

(56) References Cited

U.S. PATENT DOCUMENTS

| 2010/0141646 | A1 | 6/2010 | Tanabe | |
| 2014/0376227 | A1* | 12/2014 | Schubert | F21V 23/001 |
| | | | | 362/249.02 |

(Continued)

FOREIGN PATENT DOCUMENTS

| CN | 107077819 A | 8/2017 |
| CN | 107591125 A | 1/2018 |

(Continued)

OTHER PUBLICATIONS

International Search Report mailed on Oct. 26, 2022, in corresponding International Application No. PCT/CN2022/108236, 6 pages (partial English translation provided).

(Continued)

*Primary Examiner* — Mark Edwards
(74) *Attorney, Agent, or Firm* — Maier & Maier, PLLC

(57) ABSTRACT

A display panel and a display apparatus, the display panel includes a first display area and a second display area, and a light transmittance of the first display area is greater than a light transmittance of the second display area. The display panel includes sub-pixel units located in the first display area and pixel driving units located in the second display area. Each of the sub-pixel units includes first sub-pixels, the pixel driving units are electrically connected with the first sub-pixels, and each of the pixel driving units includes a plurality of first pixel driving circuits connected in parallel.

20 Claims, 4 Drawing Sheets

(52) U.S. Cl.
CPC ............... *G09G 2300/0842* (2013.01); *G09G 2320/0233* (2013.01)

(58) Field of Classification Search
USPC ........................................................ 345/694
See application file for complete search history.

(56) References Cited

U.S. PATENT DOCUMENTS

| | | |
|---|---|---|
| 2020/0098837 A1 | 3/2020 | Bian |
| 2021/0327958 A1 | 10/2021 | Li et al. |

FOREIGN PATENT DOCUMENTS

| | | | | | |
|---|---|---|---|---|---|
| CN | 110400543 | A | | 11/2019 | |
| CN | 110783384 | A | | 2/2020 | |
| CN | 110890026 | A | * | 3/2020 | ............. G09F 9/302 |
| CN | 111192902 | A | | 5/2020 | |
| CN | 111208679 | A | | 5/2020 | |
| CN | 112951854 | A | | 6/2021 | |
| CN | 216623636 | U | | 5/2022 | |
| CN | 114678477 | A | | 6/2022 | |
| WO | WO-2021147086 | A1 | * | 7/2021 | ........... G09G 3/3233 |

OTHER PUBLICATIONS

Office Action issued on Sep. 10, 2024, in corresponding Japanese Application No. 2023-563894, 14 pages.

* cited by examiner

DISPLAY PANEL AND DISPLAY APPARATUS

CROSS-REFERENCE TO RELATED APPLICATIONS

This application is a continuation application of International Application No. PCT/CN2022/108236, filed on Jul. 27, 2022, which claims priority to Chinese Patent Application No. 202123155370.7, filed on Dec. 15, 2021, all of which are incorporated herein by reference in their entireties.

TECHNICAL FIELD

The present application relates to the field of display technology, and particularly to a display panel and a display apparatus.

BACKGROUND

With the rapid development of electronic devices, demands of users for the screen-to-body ratio are higher and higher, resulting in that the full-screen display of electronic devices attracts more and more attention in the industry.

Electronic devices such as a cell phone and a tablet computer need to integrate a front camera, a telephone receiver, an infrared sensing component and the like. In the prior art, a notch or a hole can be formed in the display screen so that external light can enter the photosensitive component under the screen through the notch or the hole. Nonetheless, these electronic devices do not achieve a real full-screen display, and cannot display an image in all areas of the entire screen. For example, the area corresponding to the front camera of these electronic devices cannot display the image.

SUMMARY

The present application provides a display panel and a display apparatus, at least a part of the display panel can be light-transmitting and can be used for display, which is beneficial for the under-screen integration of the photosensitive components.

In a first aspect, embodiments of the present application provide a display panel including a first display area and a second display area, a light transmittance of the first display area being greater than a light transmittance of the second display area, the display panel including: one or more sub-pixel units located in the first display area, each of the sub-pixel units including one or more first sub-pixels; and one or more pixel driving units located in the second display area and electrically connected with the first sub-pixels, and each of the pixel driving units including a plurality of first pixel driving circuits connected in parallel.

In another aspect, the embodiments of the present application provide a display apparatus including the display panel according to the above embodiments.

In the display panel and display apparatus according to the embodiments of the present application, the pixel driving units for the first sub-pixels in the first display area are arranged in the second display area, which can effectively increase the light transmittance of the first display area. Furthermore, the pixel driving unit includes a plurality of first pixel driving circuits connected in parallel, so that the capability of the pixel driving unit for driving the first sub-pixels in the first display area is improved, the brightness of the first display area is increased, the brightness difference between the first display area and the second display area can be reduced, and thus the display consistency of the display panel is improved.

BRIEF DESCRIPTION OF THE DRAWINGS

Features, advantages, and technical effects of exemplary embodiments of the present application will be described below with reference to the accompanying drawings. In the accompanying drawings, the same reference numerals are used for the same components. The accompanying drawings are not drawn to actual scale.

DETAILED DESCRIPTION

Features and exemplary embodiments of various aspects of the present application will be described in detail below. Numerous specific details are set forth in the following detailed description to provide a thorough understanding of the present application. However, it is apparent to a person skilled in the art that the present application can be implemented without some of these specific details. The following description of the embodiments is merely to provide a better understanding of the present application by illustrating examples of the present application. In the accompanying drawings and the following description, the well-known structures and techniques are not shown to avoid unnecessary obscurity of the present application. In addition, the size of some structures may be exaggerated for clarity. Furthermore, the features, structures, or characteristics described below may be combined in one or more embodiments in any suitable manner.

In an electronic device such as a mobile phone and a tablet computer, photosensitive components such as a front camera, an infrared light sensor, and a proximity light sensor need to be integrated at a side on which the display panel is arranged. In some embodiments, a light-transmitting display area may be arranged on the electronic device and the photosensitive components may be arranged at the back of the light-transmitting display area, so that a full-screen display can be achieved for the electronic device while ensuring that the photosensitive components operate normally. In order to increase the light transmittance of the light-transmitting display area, the pixel driving circuits corresponding to the sub-pixels in the light-transmitting display area are usually arranged at a periphery of the light-transmitting display area. However, in some cases, the capability of the pixel driving circuits for driving the sub-pixels in the light-transmitting display area is insufficient, therefore the display brightness of the light-transmitting display area of the display panel is different from the display brightness of its peripheral areas, resulting in a display difference in the display panel and affecting the display effect.

In view of the above, the embodiments of the present application provide a display panel and a display apparatus, which will be described below with reference to the accompanying drawings. The embodiments of the present application provide a display panel, which may be an organic light emitting diode (OLED) display panel.

Figure 1:
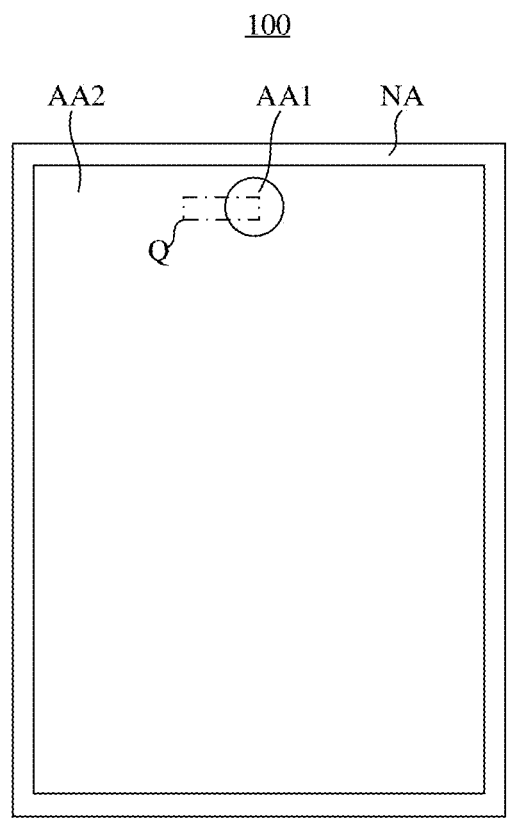
FIG. 1 shows a front view of a display panel according to the embodiments of the present application.

FIG. 1 shows a schematic front view of a display panel according to the embodiments of the present application.

As shown in FIG. 1, the display panel 100 includes a first display area AA1, a second display area AA2 and a non-display area NA arranged surrounding the second display area AA2, and a light transmittance of the first display area AA1 is greater than a light transmittance of the second display area AA2.

In some embodiments, the light transmittance of the first display area AA1 is greater than or equal to 15%. In order to ensure that the light transmittance of the first display area AA1 is greater than 15%, or greater than 40%, or even a higher light transmittance, the light transmittances of various functional film layers of the display panel 100 in the embodiment are all greater than 80%, or even the light transmittances of at least part of the functional film layers are greater than 90%.

In the display panel 100 according to the embodiments of the present application, the light transmittance of the first display area AA1 is greater than the light transmittance of the second display area AA2, so that the photosensitive components can be integrated at the back of the first display area AA1 of the display panel 100 to realize under-screen integration for the photosensitive components such as cameras, while the first display area AA1 can display images, the display area of the display panel 100 is increased, and a full-screen design is achieved for the display apparatus. The number of the first display area AA1 and the second display area AA2 may be set in a variety of ways, for example, the number of the first display areas AA1 and the second display areas AA2 is one, so as to achieve the under-screen integration for the photosensitive components or fingerprint recognition. Alternatively, in some other embodiments, the number of the first display areas AA1 is two, in which one of the first display areas AA1 is used for the under-screen integration of the photosensitive components and the other one of the first display areas AA1 is used for the fingerprint recognition.

In some embodiments, in order to increase the light transmittance of the first display area AA1, the driving circuits for driving the first display area AA1 are placed in the second display area AA2. The inventors have found that when the driving circuits for driving the first display area AA1 are placed in the second display area AA2, the capability of the driving circuits for driving the first sub-pixels 111 in the first display area AA1 is insufficient, which causes that the display brightness of the first display area AA1 is lower than the display brightness of the second display area AA2, resulting in a display difference between the first display area AA1 and the second display area AA2.

Figure 2:
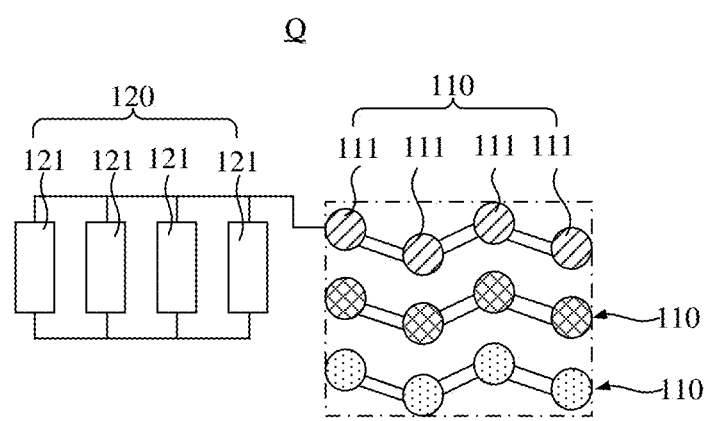
FIG. 2 shows a partial enlarged view at Q in FIG. 1.

Referring to FIG. 2, which shows a partial enlarged view at Q in the display panel 100 according to an embodiment of the present application.

As shown in FIG. 1 and FIG. 2, the display panel 100 according to the embodiments of the present application includes sub-pixel units 110 and first pixel driving circuits 121. The sub-pixel units 110 are located in the first display area AA1, and the sub-pixel unit 110 includes first sub-pixels 111. The pixel driving units 120 are located in the second display area AA2 and electrically connected with the first sub-pixels 111, and the pixel driving unit 120 includes a plurality of first pixel driving circuits 121 connected in parallel.

Specifically, the sub-pixel unit 110 may include one first sub-pixel 111 or may include a plurality of first sub-pixels 111 of a same color, which is not limited herein.

The first sub-pixel 111 may include a first electrode, a second electrode, and a light-emitting structure arranged between the first electrode and the second electrode, and the first electrode and the second electrode can form a potential difference so that the light-emitting structure emits light under the potential difference. For different sub-pixel units 110, the colors of light emitted by the light-emitting structures of the first sub-pixels 111 may be the same or different.

The first sub-pixel 111 and the first pixel driving circuit 121 are arranged in different layers, the first electrode is arranged at a side of the first sub-pixel 111 close to the first pixel driving circuit 121, and the first pixel driving circuit 121 is electrically connected with the first electrode. In an embodiment where the sub-pixel unit 110 includes a plurality of first sub-pixels 111 of a same color, the plurality of first sub-pixels 111 of the same color may be electrically connected with each other, and the first pixel driving circuit 121 is electrically connected with the first electrode of one of the plurality of first sub-pixels 111 of the same color in the sub-pixel unit 110. In this way, the circuit connecting structure of the first display area AA1 can be simplified, thereby increasing the light transmittance of the display panel 100.

The first pixel driving circuit 121 may include a thin film transistor, which is electrically connected with the first electrode of the first sub-pixel 111 through the drain electrode of the thin film transistor.

The pixel driving unit 120 may include two first pixel driving circuits 121 connected in parallel, or may include more first pixel driving circuits 121 connected in parallel with each other, which is not limited herein. One pixel driving unit 120 may be connected with the first sub-pixels 111 in one sub-pixel unit 110, or one pixel driving unit 120 may be connected with the first sub-pixels 111 in a plurality of sub-pixel units 110 of the same color, that is, one pixel driving unit 120 may drive one sub-pixel unit 110, or one pixel driving unit 120 may simultaneously drive a plurality of sub-pixel units 110.

In some embodiments, the two first pixel driving circuits 121 in the pixel driving unit 120 are connected in parallel means that at least one signal input terminal of one first pixel driving circuit 121 and at least one signal input terminal of the other first pixel driving circuit 121 are provided with a same signal, and at least one signal output terminal of one first pixel driving circuit 121 and at least one signal output terminal of the other first pixel driving circuit 121 output a same signal. The pixel driving unit 120 includes a plurality of first pixel driving circuits 121 connected in parallel, which can effectively improve the driving capability of the pixel driving unit 120, thereby increasing the brightness of the first display area AA1.

In the display panel 100 according to the embodiments of the present application, the pixel driving units 120 for the first sub-pixels 111 in the first display area AA1 are arranged in the second display area AA2, which can effectively increase the light transmittance of the first display area AA1. Furthermore, the pixel driving unit 120 includes a plurality of first pixel driving circuits 121 connected in parallel, so that the capability of the pixel driving unit 120 for driving the first sub-pixels 111 in the first display area AA1 is improved, the brightness of the first display area AA1 is increased, the brightness difference between the first display area AA1 and the second display area AA2 can be reduced, and thus the display consistency of the display panel 100 is improved.

In some embodiments, one of the sub-pixel units 110 includes a plurality of first sub-pixels 111 of the same color, and the plurality of first sub-pixels 111 are electrically connected.

The plurality of first sub-pixels 111 may be connected in series or in parallel, which is not limited herein. Exemplarily, the second electrodes of the plurality of first sub-pixels 111 are formed integrally and the first electrodes of the plurality of first sub-pixels 111 are conductively connected, then the parallel connection of the plurality of first sub-pixels 111 can be achieved.

The plurality of first sub-pixels 111 of the same color are electrically connected, therefore the plurality of first sub-pixels 111 of the same color can be simultaneously driven to emit light by one pixel driving unit 120, and the pixel circuits of the pixel driving unit 120 only need to be connected with one of the plurality of first sub-pixels 111 of the same color so as to cause the plurality of first sub-pixels 111 of the same color in one sub-pixel unit 110 to emit light. In this way, the circuit structure in the first display area AA1 can be further simplified, thereby increasing the light transmittance of the first display area AA1.

The display panel 100 may include one sub-pixel unit 110 or a plurality of sub-pixel units 110. The first sub-pixels 111 in different sub-pixel units 110 may emit light of the same or different colors according to the specific requirements of the display panel 100, which is not limited herein. In some embodiments, the display panel 100 includes a plurality of sub-pixel units 110, and one first sub-pixel 111 in one sub-pixel unit 110 is electrically connected with one pixel driving unit 120.

The display panel 100 includes a plurality of sub-pixel units 110, that is, a plurality of sub-pixel units 110 are arranged in the first display area AA1, and the first sub-pixels 111 in the plurality of sub-pixel units 110 may emit light of different colors or a same color according to the actual needs. In this way, the pixel density of the first display area AA1 can be increased, thereby improving the display effect of the first display area AA1. Exemplarily, the first display area AA1 includes the first sub-pixels 111 emitting red light, the first sub-pixels 111 emitting blue light, and the first sub-pixels 111 emitting green light, thereby enriching the colors of the first display area AA1. One first sub-pixel 111 in one sub-pixel unit 110 is electrically connected with one pixel driving unit 120, that is, one pixel driving unit 120 drives one sub-pixel unit 110, which is beneficial for improving the capability of the pixel driving unit 120 for driving the first sub-pixel 111 and simplifying the circuit structure inside the display panel 100.

In some embodiments, the first pixel driving circuit 121 is any of a 2T1C circuit, a 3T1C circuit, a 3T2C circuit, a 4T1C circuit, a 5T1C circuit, a 6T1C circuit, a 7T1C circuit, a 7T2C circuit, and a 9T1C circuit. Herein, the "2T1C circuit" refers to the first pixel driving circuit 121 including two thin film transistors (T) and one capacitor (C), and the same applies to "3T1C circuit", "3T2C circuit", "4T1C circuit", "5T1C circuit", "6T1C circuit", "7T1C circuit", "7T2C circuit", "9T1C circuit", and the like.

A number of the first sub-pixels 111 in the sub-pixel unit 110 may be greater than, less than, or equal to a number of the first pixel driving circuits 121 in the pixel driving unit 120 corresponding to the sub-pixel unit 110, which is not limited herein.

In some embodiments, the number of the first pixel driving circuits 121 in the pixel driving unit 120 is less than the number of the first sub-pixels 111 in the sub-pixel unit 110 corresponding to the pixel driving unit 120.

In this way, the driving capability of the pixel driving unit 120 can be guaranteed and the brightness of the first display area AA1 can be increased, therefore the display difference between the first display area AA1 and the second display area AA2 can be reduced to improve the display uniformity of the display panel 100, while the wiring structure of the pixel driving unit 120 can be simplified.

In some embodiments, the display panel 100 further includes second pixel driving circuits (not shown) located in the second display area AA2 and configured to drive second sub-pixels (not shown) located in the second display area AA2.

In some other embodiments, the number of the first pixel driving circuits 121 in the pixel driving unit 120 is equal to the number of the first sub-pixels 111 in the sub-pixel unit 110 corresponding to the pixel driving unit 120.

In this way, one first pixel driving circuit 121 can correspondingly drive one first sub-pixel 111 in the first display area AA1, so that the capability of the first pixel driving circuit 121 for driving the first sub-pixel 111 is equivalent to the capability of the second pixel driving circuit for driving the second sub-pixel in the second display area AA2, and while the brightness of the first display area AA1 is increased, the possibility that the brightness of the first display area AA1 is excessively higher than the brightness of the second display area AA2 is reduced to further reduce the brightness difference between the first display area AA1 and the second display area AA2, the display uniformity of the display panel 100 is improved.

The architecture of the second pixel driving circuit may be the same as or different from that of the first pixel driving circuit 121, depending on the specific requirements. Herein, the architectures of the circuits are the same means that the connecting relationships of various structures in the schematic diagrams of the circuits are the same, but the architectures of two circuits are the same does not mean that the structures of the two circuits are the same, for example, does not mean that the layout design structures of the two circuits are the same.

In some embodiments, the architecture of the second pixel driving circuit is the same as the architecture of the first pixel driving circuit 121, and the structure of capacitor and thin film transistor in the first pixel driving circuit 121 is the same as the structure of corresponding capacitor and thin film transistor in the second pixel driving circuit.

Specifically, the first pixel driving circuit 121 and the second pixel driving circuit may include a plurality of thin film transistors, since their architectures are the same, structures of the thin film transistors located at a same position in respective circuit architecture are the same, and structures of the capacitors located at a same position in the respective circuit architectures are also the same. In this way, the driving capabilities of the first pixel driving circuit 121 and the second pixel driving circuit are equal. The light-emitting brightness of one first sub-pixel 111 driven by the first pixel driving circuit 121 is the same as the light-emitting brightness of one second sub-pixel driven by the second pixel driving circuit. In this way, the light-emitting brightness consistency of the first display area AA1 and the second display area AA2 can be further guaranteed and the display uniformity of the display panel 100 can be improved.

Figure 3:
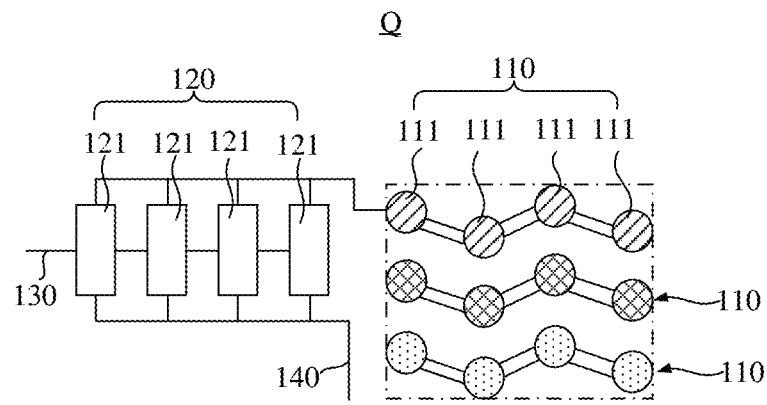
FIG. 3 shows another partial enlarged view at Q in FIG. 1.

FIG. 3 shows a partial enlarged view at Q in the display panel 100 according to another embodiment of the present application.

In some embodiments, as shown in FIG. 3, the display panel 100 further includes a scan signal line 130 arranged in the second display area AA2, the plurality of first pixel driving circuits 121 in one of the pixel driving units 120 are electrically connected with a same scan signal line 130 configured to transmit scan signals to the first pixel driving circuits 121.

In some embodiments, the first pixel driving circuit 121 includes a thin film transistor, and the scan signal line 130 may be connected with the gate electrode of the thin film transistor to control whether the thin film transistor to be turned on or not, thereby controlling whether the first sub-pixels 111 in the sub-pixel unit 110 corresponding to the first pixel driving circuit 121 to emit light. The plurality of first pixel driving circuits 121 in the pixel driving unit 120 are connected with the same scan signal line 130, so that the plurality of first pixel driving circuits 121 in the pixel driving unit 120 can be simultaneously turned on or turned off, facilitating controlling whether the sub-pixel unit 110 to emit light or not.

In some embodiments, the display panel 100 further includes a data signal line 140 arranged in the second display area AA2, the plurality of first pixel driving circuits 121 in one of the pixel driving units 120 are electrically connected with a same data signal line 140 configured to input data signals to the first pixel driving circuits 121.

In some embodiments, the first pixel driving circuit 121 includes a thin film transistor, and the data signal line 140 may be connected with the source electrode or the drain electrode of the thin film transistor for inputting the data signals to the first pixel driving circuit 121 to control the light-emitting brightness of the first sub-pixels 111. In this way, the circuit structure inside the display panel 100 can be further simplified.

In other embodiments, the display panel 100 further includes a light-emitting control signal line located in the second display area AA2, the plurality of first pixel driving circuits 121 in one of the pixel driving units 120 are electrically connected with the same light-emitting control signal line configured to input light-emitting control signals to the first pixel driving circuits 121. Specifically, in some embodiments, the first pixel driving circuit 121 includes a thin film transistor, and the light-emitting control signal line is connected with the gate electrode of the thin film transistor for controlling the corresponding light-emitting structure to emit light.

The plurality of first pixel driving circuits 121 in one pixel driving unit 120 may be distributed in various forms, for example, they may be located in a same row or a same column, or distributed in a plurality of rows and a plurality of columns, or distributed in other irregular forms, which is not limited herein, provided that the parallel connection can be achieved.

In some embodiments, as shown in FIG. 3, the plurality of first pixel driving circuits 121 in one of the pixel driving units 120 are located in the same row.

Thus, the scan signal line 130 may be simultaneously connected with the plurality of first pixel driving circuits 121 in the same row and extend along the row direction of the first pixel driving circuits 121, and in order to be connected with the plurality of first pixel driving circuits 121 in the same row, the data signal line 140 may have a plurality of branches. In some other embodiments, the data signal line 140 may extend along the row direction of the plurality of first pixel driving circuits 121, and in this case, the data signal line 140 does not have a branch, while the scan signal line 130 have a plurality of branches.

The plurality of first pixel driving circuits 121 in one pixel driving unit 120 are located in the same row, which is beneficial for the parallel connection among the plurality of first pixel driving circuits 121 and the electrical connection between an external control signal line and the first pixel driving circuits 121, thereby transmitting driving signals to the first pixel driving circuits 121. In this way, the wiring structure inside the display panel 100 is further simplified.

In some other embodiments, the plurality of first pixel driving circuits 121 in one of the pixel driving units 120 are located in the same column.

In this way, the scan signal line 130 is simultaneously connected with a plurality of first pixel driving circuits 121 in a same column, the data signal line 140 may extend along the column direction of the first pixel driving circuits 121, and in order to be connected with the plurality of first pixel driving circuits 121 in the same column, the scan signal line 130 may have a plurality of branches.

The plurality of first pixel driving circuits 121 in one pixel driving unit 120 are located in the same column, which is beneficial for the parallel connection among the plurality of first pixel driving circuits 121 and the electrical connection between an external control signal line and the first pixel driving circuits 121, thereby transmitting driving signals to the first pixel driving circuits 121. In this way, the wiring structure inside the display panel 100 can be simplified.

Figure 4:
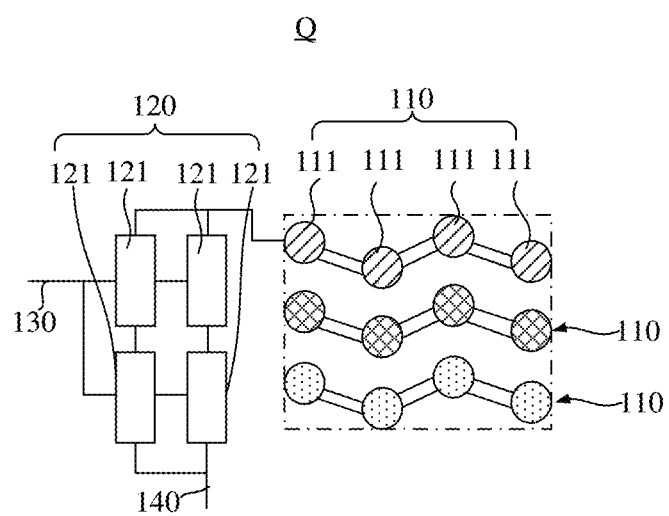
FIG. 4 shows yet another partial enlarged view at Q in FIG. 1.

In some embodiments, as shown in FIG. 4, the plurality of first pixel driving circuits 121 in one of the pixel driving units 120 are distributed in a plurality of rows and in a plurality of columns. Thus, the scan signal line 130 may be distributed along the row direction of the plurality of first pixel driving circuits 121, the data signal line 140 may be distributed along the column direction of the plurality of first pixel driving circuits 121, the number of branches of the scan signal line 130 is the same as the number of rows of the plurality of first pixel driving circuits 121, and the number of branches of the data signal line 140 is the same as the number of columns of the plurality of first pixel driving circuits 121. In this way, the number of branches of the data signal line 140 can be effectively reduced, and moreover, the number of rows and columns of the plurality of first pixel driving circuits 121 in one pixel driving unit 120 can be distributed rationally according to the circuit arrangement space inside the display panel 100.

Arrangements of the first pixel driving circuits 121 of different pixel driving units 120 in a same display panel 100 may be the same or different, depending on the circuit arrangement inside the display panel 100, which is not limited herein.

When designing the circuit structure inside the display panel 100, in specific situations, the driving circuit and the first sub-pixels 111 electrically connected with the driving circuit may be distributed in the same row or different rows according to specific space needs, which is not limited herein. In some embodiments, at least part of the first pixel driving circuits 121 and the first sub-pixels 111 electrically connected with the part of the first pixel driving circuits 121 are distributed in a same row.

It can be appreciated that if the first driving circuit 121 and the first sub-pixels 111 electrically connected with the first driving circuit 121 are distributed in the same row, the connecting line for them may extend between them along the row direction without branches or bending. In this way, the connecting lines between the driving circuits and the first sub-pixels 111 can be further simplified, which can in turn simplify the fabrication process in manufacturing the display panel 100.

In an embodiment in which the sub-pixel unit 110 includes a plurality of first sub-pixels 111 of a same color, the plurality of first sub-pixels 111 may be electrically connected through transparent conductive lines or non-transparent conductive lines, which is not limited herein.

In some embodiments, the plurality of first sub-pixels 111 of the same color in one of the sub-pixel units 110 are electrically connected through transparent conductive lines.

Specifically, the transparent conductive line may be made of one or both of indium tin oxide and indium zinc oxide. The plurality of first sub-pixels 111 are electrically connected through transparent conductive lines, the light transmittance of the first display area AA1 can be further increased.

In some other embodiments, the plurality of first pixel driving circuits 121 in one of the pixel driving units 120 are respectively electrically connected with one of the first sub-pixels 111 in the sub-pixel unit 110 corresponding to the pixel driving unit 120 through transparent conductive lines. In this way, the light transmittance of the first display area AA1 can be increased while improving the driving capability for the first sub-pixels 111.

In some embodiments, the plurality of first pixel driving circuits 121 in one of the pixel driving units 120 are connected in parallel and then electrically connected with one of the first sub-pixel 111 in the sub-pixel unit 110 corresponding to the pixel driving unit 120 through transparent conductive lines. In this way, the light transmittance of the first display area AA1 can be increased while simplifying the line structure inside the display panel 100.

In some embodiments, the first sub-pixel 111 includes a first electrode, a first light-emitting structure located on the first electrode, and a second electrode located on the first light-emitting structure. Specifically, the first electrode may be the anode, the second electrode may be the cathode, the light-emitting structure emits light under the potential difference between the first electrode and the second electrode, and correspondingly the display panel 100 is an OLED display panel, the display effect is improved.

In some embodiments, for connecting the first sub-pixels 111 of the same color in parallel, the first electrodes of adjacent first sub-pixels 111 of the same color in one of the sub-pixel units 110 are electrically connected through transparent conductive lines. Since the first sub-pixels 111 can share one second electrode, that is, the second electrodes of adjacent first sub-pixels 111 of the same color in one of the sub-pixel units 110 are electrically connected, and the first electrodes are electrically connected through the transparent conductive lines, the light transmittance of the first display area AA1 is increased while connecting the adjacent first sub-pixels 111 of the same color in one of the sub-pixel units 110 in parallel.

Since the plurality of first sub-pixels 111 of the same color in one of the sub-pixel units 110 are not necessarily adjacent, in some embodiments, the first electrodes of the plurality of first sub-pixels 111 of the same color in one of the sub-pixel units 110 are electrically connected in sequence through the transparent conductive lines. In this way, the light transmittance of the first display area AA1 can be increased while connecting the plurality of first sub-pixels 111 in one of the sub-pixel units 110 in parallel.

Figure 5:
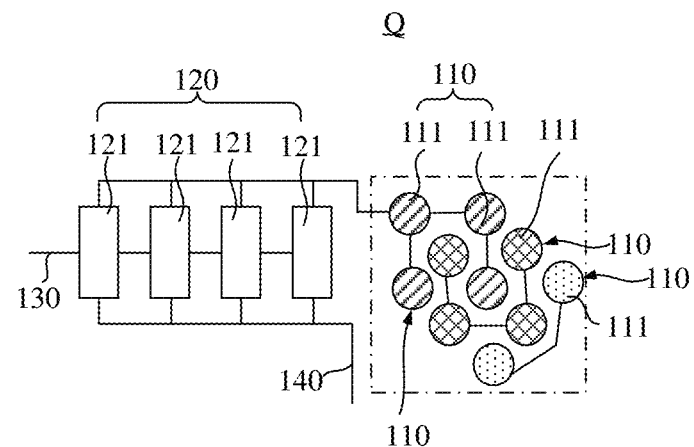
FIG. 5 shows yet another partial enlarged view at Q in FIG. 1.

In some embodiments, as shown in FIG. 5, the first electrodes of a plurality of first sub-pixels 111 emitting light of the same color in one of the sub-pixel units 110 are electrically connected in sequence through the transparent conductive lines and arranged surrounding an outer side of at least one of the first sub-pixels 111 emitting light of a different color. In this way, the first sub-pixels 111 emitting light of different colors are spaced apart, which is beneficial for increasing the pixel density of the first display area AA1 and making the first display area AA1 have a better display effect.

In some embodiments, the plurality of first pixel driving circuits 121 in one of the pixel driving units 120 are connected in parallel through transparent conductive lines or non-transparent conductive lines, and then electrically connected with one of the first sub-pixels 111 in the sub-pixel unit 110 corresponding to the pixel driving unit 120 through one transparent conductive line or one non-transparent conductive line. In this way, the capability of the pixel driving unit 120 for driving the corresponding sub-pixel unit 110 can be improved.

A second pixel driving circuit may or may not be arranged between two adjacent first pixel driving circuits 121 in one pixel driving unit 120, which is not limited herein.

In some embodiments, n second pixel driving circuits are arranged between two adjacent first pixel driving circuits 121 in one of the pixel driving units 120, and n is a natural number greater than 1. In this way, the first pixel driving circuits 121 and the second pixel driving circuits can be rationally positioned so as to simplify the circuit structure inside the display panel 100.

The specific value of n may be selected as desired, and in some embodiments, n is a natural number in a range of 2 to 8, which is beneficial for the circuit arrangement inside the display panel 100. In some embodiments, the plurality of first pixel driving circuits 121 connected in parallel in one of the pixel driving units 120 are uniformly distributed in the second display area AA2, which is more beneficial for the line arrangement in the second display area AA2 and the fabrication of the pixel driving units 120.

In some embodiments, the plurality of first pixel driving circuits 121 connected in parallel in one of the pixel driving units 120 are distributed in an array in the second display area AA2, and between adjacent first pixel driving circuits 121, the number of second pixel driving circuits in a first direction or the number of second pixel driving circuits in a second direction are approximately equal, which is beneficial for the line arrangement of the first pixel driving circuits 121 in a same pixel driving unit 120, the parallel connection among the first pixel driving circuits 121, and the fabrication of the display panel 100. In the context of the present disclosure, the word "approximately" means that it may be strictly equal to or approximately equal to the value mentioned. For example, a value of ±10% error can be regarded as approximately equal to the mentioned value.

In some embodiments, the plurality of first pixel driving circuits 121 connected in parallel in one of the pixel driving units 120 are arranged in an array in the second display area AA2, and between adjacent first pixel driving circuits 121, the number of second pixel driving circuits in the first direction or the second direction is m, and m is a natural number greater than 1. In this way, the capability of the pixel driving unit 120 for driving the sub-pixel unit 110 can be improved by arranging the second pixel driving circuits in the gaps between adjacent first pixel driving circuits 121.

The specific value of m may be selected as desired, and in some embodiments, m is a natural number in a range of 2 to 8, which is beneficial for the circuit arrangement inside the display panel 100.

The first direction may intersect with the second direction, and exemplarily, the first direction is the row direction and the second direction is the column direction, that is, the first direction and the second direction are perpendicular to each other, which is beneficial for the circuit arrangement of the first pixel driving circuits 121 in the pixel driving unit 120.

The transparent conductive line serves as conductive medium for electrically connecting the first sub-pixels 111 of the same color and is configured as a straight line or a curve in the first display area AA1, and the width of the transparent conductive line may be selected according to the specific position.

In some embodiments, a trace of the transparent conductive line within the first display area AA1 is a curve or a straight line. The transparent conductive lines are of equal or unequal width. That is, the uniformity of the trace and width of the transparent conductive line is not limited, provided that the first sub-pixels 111 of a same color can be electrically connected.

The shape of the first electrode is not limited, provided that the first electrode can cooperate with the second electrode to cause the light-emitting structure to emit light.

In some embodiments, an outer contour shape of an orthographic projection of the first electrode on the display panel 100 is any of the following shapes: a drop shape, a circular shape, a rectangular shape, an oval shape, a diamond shape, a semi-circular shape or a semi-oval shape. In this way, the display panel 100 can emit light.

The proportion of area occupied by the first electrodes in the first display area AA1 is not limited. In some embodiments, a total area of the first electrodes in the first display area AA1 is from 8% to 23% of an area of the first display area AA1. In this way, the light transmittance of the first display area AA1 can be increased while achieving the display function of the first display area AA1.

Figure 6:
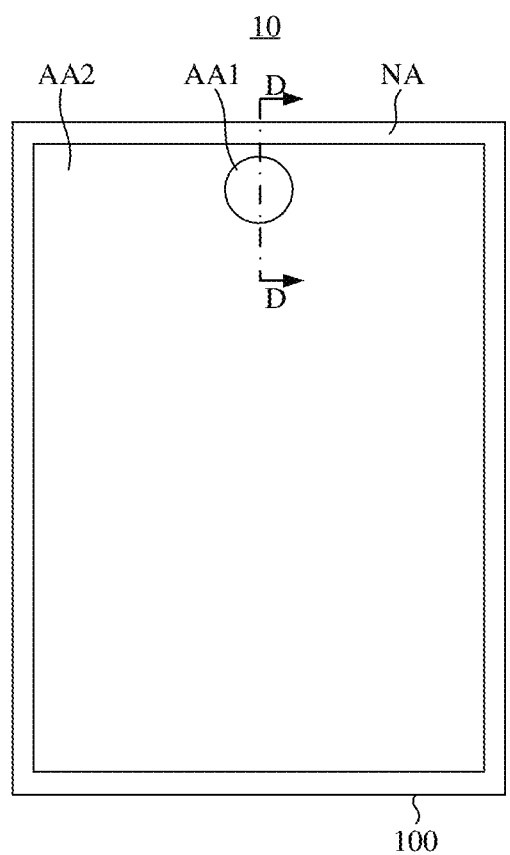
FIG. 6 shows an annotation diagram of a display apparatus according to the embodiments of the present application.
Figure 7:
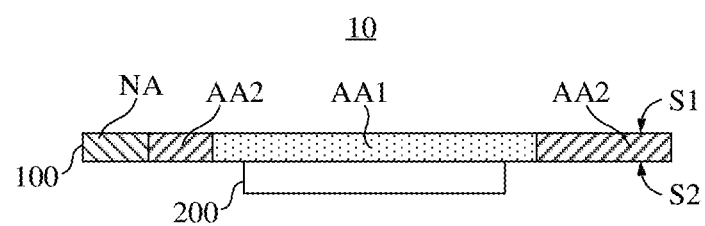
FIG. 7 shows a schematic cross-sectional view along direction D-D in FIG. 6.

FIG. 6 shows a schematic structural diagram of a display apparatus 10 according to the embodiments of the present application, and FIG. 7 shows a schematic cross-sectional view along D-D in FIG. 6.

The embodiments of the present application further provide a display apparatus 10 including the display panel 100 according to any of the embodiments described above, as shown in FIG. 6 and FIG. 7.

The display panel 100 includes the first display area AA1 and the second display area AA2, and the light transmittance of the first display area AA1 is greater than the light transmittance of the second display area AA2.

The display panel 100 includes a first surface S1 and a second surface S2 opposite to each other, and the first surface S1 is the display surface. The display apparatus 10 further includes a photosensitive component 200 located at a side of the display panel 100 corresponding to the second surface S2, and the photosensitive component corresponds to the position of the first display area AA1.

The photosensitive component 200 may be an image capturing component for capturing external image information. In some embodiments, the photosensitive component 200 is a complementary metal oxide semiconductor (CMOS) image capturing component. In some other embodiments, the photosensitive component 200 may be other image capturing component such as a charge-coupled device (CCD) image capturing component. The photosensitive component 200 may not be limited to an image capturing component, for example, in some embodiments, the photosensitive component 200 may be a light sensor such as an infrared sensor, a proximity sensor, an infrared lens, a floodlight sensing element, an ambient light sensor, and a dot matrix projector. In addition, other components may be integrated at the side of the display panel 100 of the display apparatus corresponding to the second surface S2, such as an earpiece or a speaker.

In the display apparatus 10 according to the embodiments of the present application, the pixel driving unit 120 includes a plurality of first pixel driving circuits 121 connected in parallel so as to drive the first sub-pixels 111 in the first display area AA1 collectively. In this way, the capability of the driving circuits for driving the first sub-pixels 111 in the first display area AA1 can be improved, the light-emitting brightness of the first display area AA1 can be guaranteed, and the brightness difference between the first display area AA1 and the second display area AA2 can be reduced.

Those skilled in the art should understand that all the above embodiments are all illustrative rather than restrictive. Different technical features recited in different embodiments can be combined to achieve beneficial effects. Those skilled in the art should be able to understand and implement other modified embodiments of the disclosed embodiments on the basis of studying the drawings, the description, and claims. In the present disclosure, the term "comprise" does not exclude other means or steps; an article is intended to include one or more articles when it is not modified by a quantifier, and can be used interchangeably with "one or more articles"; and the terms "first", "second" and the like are used to denote names and not to denote any particular order. Any numeral reference in the claims should not be construed as limiting the protection scope. The functions of several parts recited in the claims can be implemented by a single hardware or software module. Some technical features are recited in different dependent claims, but this does not mean that these technical features cannot be combined to obtain beneficial effects.

What is claimed is:

1. A display panel comprising a first display area and a second display area, a light transmittance of the first display area being greater than a light transmittance of the second display area, the display panel comprising:
   one or more sub-pixel units located in the first display area, wherein each of the one or more sub-pixel units comprises a plurality of first sub-pixels;
   one or more pixel driving units located in the second display area and electrically connected with the plurality of first sub-pixels, wherein each of the one or more pixel driving units comprises a plurality of first pixel driving circuits connected in parallel, n second pixel driving circuits are arranged between two adjacent first pixel driving circuits in one of the pixel driving units, and n is a natural number in a range of 2 to 8, and a number of the plurality of the first pixel driving circuits connected in parallel in at least one pixel driving unit of the one or more pixel driving units is less than or equal to a number of the plurality of first sub-pixels in the sub-pixel unit corresponding to the at least one pixel driving unit.

2. The display panel according to claim 1, wherein one of the sub-pixel units comprises a plurality of first sub-pixels of a same color, and the plurality of first sub-pixels of the same color is electrically connected.

3. The display panel according to claim 1, wherein a number of the sub-pixel units is two or more, and one first sub-pixel in each of the sub-pixel units is electrically connected with one pixel driving unit.

4. The display panel according to claim 1, further comprising:
one or more second pixel driving circuits; and
one or more second sub-pixels located in the second display area, wherein the one or more second pixel driving circuits are configured to drive the one or more second sub-pixels located in the second display area, an architecture of each second pixel driving circuit is the same as an architecture of each first pixel driving circuit, and a structure of capacitor and thin film transistor in the each pixel driving circuit is the same as a structure of corresponding capacitor and thin film transistor in each second pixel driving circuit.

5. The display panel according to claim 1, further comprising:
a scan signal line arranged in the second display area, wherein the plurality of first pixel driving circuits in one of the pixel driving units is electrically connected with a same scan signal line configured to transmit scan signals to the plurality of first pixel driving circuits.

6. The display panel according to claim 1, further comprising:
a data signal line arranged in the second display area, wherein the plurality of first pixel driving circuits in one of the one or more pixel driving units is electrically connected with a same data signal line configured to transmit data signals to the plurality of first pixel driving circuits; or
the display panel comprises a light-emitting control signal line arranged in the second display area, the plurality of first pixel driving circuits in one of the one or more pixel driving units is electrically connected with a same light-emitting control signal line configured to transmit light-emitting control signals to the plurality of first pixel driving circuits.

7. The display panel according to claim 1, wherein
the plurality of first pixel driving circuits in one of the pixel driving units are located in a same row; or
the plurality of first pixel driving circuits in one of the pixel driving units are located in a same column; or
the plurality of first pixel driving circuits in one of the pixel driving units are distributed in a plurality of rows and a plurality of columns.

8. The display panel according to claim 7, wherein at least part of the first pixel driving circuits and the plurality of first sub-pixels electrically connected with the first pixel driving circuits are distributed in a same row.

9. The display panel according to claim 1, wherein a plurality of first sub-pixels of a same color in one of the sub-pixel units are electrically connected through transparent conductive lines; or
the plurality of first pixel driving circuits in one of the pixel driving units are respectively electrically connected with one of the first sub-pixels in the sub-pixel unit corresponding to the pixel driving unit through transparent conductive lines; or
the plurality of first pixel driving circuits in one of the pixel driving units are connected in parallel and then electrically connected with one of the first sub-pixels in the sub-pixel unit corresponding to the pixel driving unit through transparent conductive lines.

10. The display panel according to claim 1, wherein each first sub-pixel of the plurality of first sub-pixels comprises;

a first electrode,
a first light-emitting structure located on the first electrode, and
a second electrode located on the first light-emitting structure.

11. The display panel according to claim 10, wherein the first electrodes of adjacent first sub-pixels of a same color in one of the sub-pixel units are electrically connected through transparent conductive lines; or
the first electrodes of a plurality of first sub-pixels of a same color in one of the sub-pixel units are electrically connected in sequence through the transparent conductive lines; or
the first electrodes of the plurality of first sub-pixels of the same color in one of the sub-pixel units are electrically connected in sequence through the transparent conductive lines, and are arranged surrounding an outer side of at least one of the first sub-pixels of a different color.

12. The display panel according to claim 1, wherein the plurality of first pixel driving circuits in one of the pixel driving units are connected in parallel through transparent conductive lines or non-transparent conductive lines, and then electrically connected with one of the first sub-pixels in the sub-pixel unit corresponding to the pixel driving unit through one transparent conductive line or one non-transparent conductive line.

13. The display panel according to claim 1, wherein the plurality of first pixel driving circuits connected in parallel in one of the pixel driving units are uniformly distributed in the second display area.

14. The display panel according to claim 1, wherein the plurality of first pixel driving circuits connected in parallel in one of the pixel driving units are distributed in an array in the second display area, and between adjacent first pixel driving circuits, a number of second pixel driving circuits in a first direction and a number of second pixel driving circuits in a second direction are approximately equal.

15. The display panel according to claim 1, wherein the plurality of first pixel driving circuits connected in parallel in one of the pixel driving units are distributed in an array in the second display area, and between adjacent first pixel driving circuits, a number of second pixel driving circuits in a first direction or a second direction is m, and m is a natural number in a range of 2 to 8.

16. The display panel according to claim 11, wherein a trace of the transparent conductive line within the first display area is a curve or a straight line; and the transparent conductive lines are of equal or unequal width.

17. The display panel according to claim 10, wherein an outer contour shape of an orthographic projection of the first electrode on the display panel is any of the following shapes: a drop shape, a circular shape, a rectangular shape, an oval shape, a diamond shape, a semi-circular shape or a semi-oval shape.

18. A display apparatus comprising the display panel according to claim 1.

19. The display panel according to claim 2, wherein the plurality of first sub-pixels of the same color is electrically connected in series in each of the sub-pixel units.

20. The display panel according to claim 10, wherein a total area of the first electrodes in the first display area is from 8% to 23% of an area of the first display area.

* * * * *